United States Patent [19]
Hara et al.

[11] Patent Number: 6,107,779
[45] Date of Patent: Aug. 22, 2000

[54] APPARATUS FOR DETECTING REMAINING CAPACITY OF BATTERY

[75] Inventors: Kazuhiro Hara; Morio Kayano, both of Ustunomiya; Kazunori Watanabe, Mooka; Shinobu Ochiai, Ustunomiya, all of Japan

[73] Assignee: Honda Giken Kogyo Kabushiki Kaisha, Tokyo, Japan

[21] Appl. No.: 09/058,290

[22] Filed: Apr. 10, 1998

[30] Foreign Application Priority Data

Apr. 14, 1997 [JP] Japan ................................ 9-096154

[51] Int. Cl.⁷ ................................................ H01M 10/46
[52] U.S. Cl. ............................................ 320/132; 320/149
[58] Field of Search .................................. 320/127, 128, 320/132, 149, FOR 142, FOR 143, DIG. 18, DIG. 19, DIG. 21; 324/427, 433; 340/635, 636; 429/61

[56] References Cited

U.S. PATENT DOCUMENTS 5,648,816  7/1997  Wakui .................................... 348/233
5,680,030  10/1997 Kadouchi et al. ...................... 320/134

*Primary Examiner*—Edward H. Tso
*Attorney, Agent, or Firm*—Arent Fox Kintner Plotkin & Kahn

[57] ABSTRACT

When a battery as an energy source for propelling an electric vehicle is repeatedly charged and discharged, the calculated remaining capacity of the battery tends to suffer a large error due to an error of a current sensor which detects a battery current. In order to detect the remaining capacity with high accuracy, a remaining capacity 1 detected on the basis of an integrated value of a discharging current and a remaining capacity 2 detected on the basis of the output power of the battery at a present time are compared with each other, and the remaining capacity is determined depending on the result of comparison. The output power of the battery at the present time depends on the remaining capacity at the present time. Thereafter, after the battery is charged and discharged in repeated cycles, the remaining capacity 1 is presumed as suffering a large error, and the remaining capacity 2 is determined as the remaining capacity, so that the remaining capacity can be detected with accuracy.

9 Claims, 11 Drawing Sheets

APPARATUS FOR DETECTING REMAINING CAPACITY OF BATTERY

BACKGROUND OF THE INVENTION

1. Field of the Invention

The present invention relates to an apparatus for detecting the remaining capacity of a battery, and more particularly to a remaining battery capacity detecting apparatus for use on an electric vehicle that is propelled by electric energy supplied from a battery as an energy source.

2. Description of the Related Art

Apparatus which use a battery as an energy source, e.g., electric vehicles or the like, often need to recognize the remaining capacity, expressed in ampere-hours (Ah), of the battery.

Heretofore, it has been customary practice to calculate the remaining capacity of a battery by correcting the fully charged capacity of the battery, i.e., an initial capacity (a calculated value or a fixed value based on battery standards, also referred to as a rated capacity) according to the following equations (1)–(3):

Remaining capacity=initial capacity−integrated discharging current (when the battery is discharged)  (1)

Remaining capacity=initial capacity+integrated charging current (when the battery is charged)  (2)

Remaining capacity=previously detected remaining capacity−estimated self-discharged quantity (when the battery is left to stand)  (3)

Basically, as can be seen from the equation (1) or (2), an initial capacity is obtained when the battery is charged to its full capacity, and then charging and discharging currents flowing into and out of the battery are detected by a current sensor. The initial capacity is corrected by an integrated value of the charging and discharging currents for thereby recognizing the remaining capacity of the battery at present.

However, the current sensor for detecting charging and discharging currents flowing into and out of the battery suffers a relatively large error. Therefore, when the battery is charged and discharged in repeated cycles without being fully charged, current sensor errors are accumulated, resulting in a reduction in the accuracy with which the remaining capacity is detected.

SUMMARY OF THE INVENTION

It is a general object of the present invention to provide a remaining battery capacity detecting apparatus which is capable of detecting the remaining capacity of a battery accurately.

A major object of the present invention is to provide a remaining battery capacity detecting apparatus which can detect a deterioration of a battery when the remaining capacity of the battery is detected, so that the initial capacity (fully charged capacity) of the battery can be corrected on the basis of the detected deterioration.

The above and other objects, features, and advantages of the present invention will become more apparent from the following description when taken in conjunction with the accompanying drawings in which preferred embodiments of the present invention are shown by way of illustrative example.

DETAILED DESCRIPTION OF THE PREFERRED EMBODIMENTS

Figure 1:
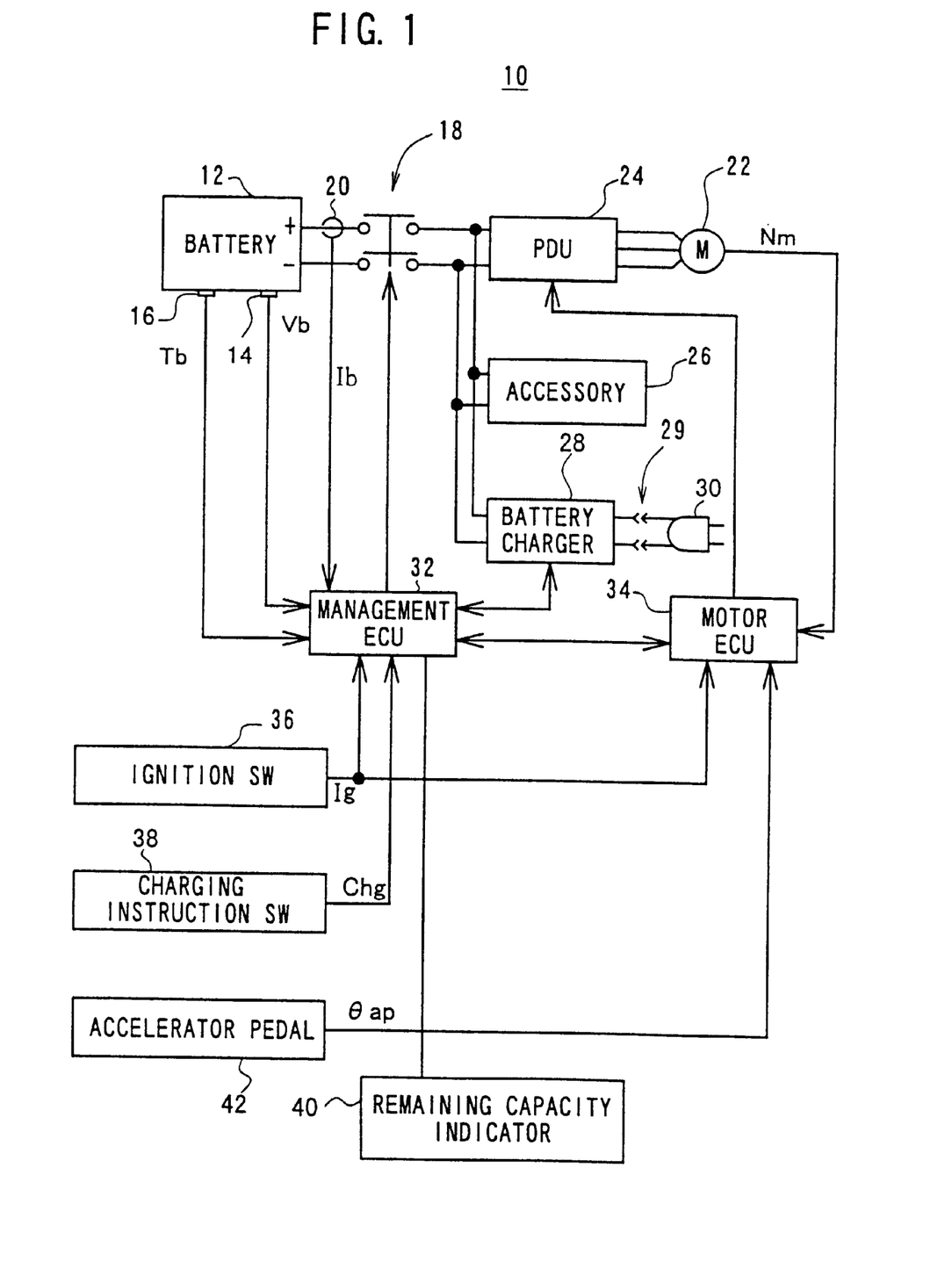
FIG. 1 is a block diagram of an electric vehicle which incorporates a remaining battery capacity detecting apparatus according to the present invention.

As shown in FIG. 1, an electric vehicle 10 which incorporates a remaining battery capacity detecting apparatus according to the present invention has a high-voltage battery 12 having a high rated voltage of +288 V. The battery 12 comprises, for example, 24 series-connected nickel-hydrogen secondary cells each having a rated voltage of +12 V. A voltage sensor (voltage detecting means) 14 is connected to the battery 12 for detecting a battery voltage Vb thereof. A temperature sensor (temperature detecting means) 16 is attached to the battery 12 for detecting a temperature Tb thereof. The voltage across each of the nickel-hydrogen secondary cells that make up the battery 12 will hereinafter be referred to as a battery cell voltage. The battery voltage Vb is equal to the product of the battery cell voltage and the number of battery cells, i.e., 24.

Positive and negative terminals of the battery 12 are connected to terminals of a contactor (relays, switches) 18 by conductors, one of which has a current sensor (current detecting means) 20 for detecting a battery current (a charging current and a discharging current) Ib which flows into and from the battery 12.

To other terminals of the contactor 18, there are connected a power drive unit (PDU) 24 for energizing a three-phase motor 22 as a load according to a PWM (Pulse Width Modulation) control process, an accessory 26 such as an air conditioner, and a vehicle-mounted battery charger 28 for charging the battery 12. The battery charger 28 is connected through a connector 29 to a plug 30 which will be connected an external power supply such as an AC 200V power supply.

The electric vehicle 10 also has a management ECU (Electric Control Unit) 32 and a motor ECU 34 each operable as control, decision, processing, calculating, time measuring means. The management ECU 32 and the motor ECU 34 exchange data therebetween. Each of the management ECU 32 and the motor ECU 34 is in the form of a microcomputer which comprises a CPU (Central Processing Unit), a ROM serving as memory means that stores a system program and an application program for detecting a remaining capacity of the battery 12, a RAM serving as working memory means for storing temporary data, a timer (time measuring means) for measuring time, and input/output interfaces including an A/D converter and a D/A converter. The management ECU 32 and the motor ECU 34 may be constructed as a single ECU.

The management ECU 32 is supplied with the battery voltage Vb from the voltage sensor 14, the battery temperature Tb from the temperature sensor 16, the battery current Ib from the current sensor 20, an ignition signal Ig generated as an on/off signal from an ignition switch 36, and a charging instruction signal Chg as an on/off signal from a charging instruction switch 38. Based on these supplied signals, the management ECU 32 controls the battery charger 28, and controls the indication of the remaining capacity of the battery 12 on a remaining capacity indicator 40 on an instrumental panel of the electric vehicle.

The motor ECU 34 is supplied with an accelerator opening signal (hereinafter also referred to as an accelerator opening) θap from an accelerator pedal of the electric vehicle, and a rotational speed signal (hereinafter also referred to as a rotational speed) Nm from an encoder attached to the motor 22. Based on these supplied signals, the motor ECU 34 controls the power drive unit 24. More specifically, the motor ECU 34 determines an output torque (also referred to as a required torque and corresponding to an electric energy required by the motor 22) to be outputted from the motor 22 based on a stored lookup table or equations, generates an energization signal indicative of a duty ratio for an inverter of the power drive unit 24 based on the determined output torque, and supplies the energization signal to the power drive unit 24.

A control process carried out by the management ECU 32 for detecting the remaining capacity of the battery 12, indicating a remaining capacity of the battery 12, and effecting other functions will be described below with reference to FIG. 2. The remaining capacity is measured in ampere-hours (Ah).

The management ECU 32 decides in a step S1 whether a present mode (status) of the battery 12 is a charging mode, a left-to-stand mode, or a discharging mode (usually referred to as a running mode) based on the combination of the levels of the ignition signal Ig and the charging instruction signal Chg which have been read. When the battery charger 28 is charging the battery 12 {the charging instruction switch 38 is turned on (closed), with the charging instruction signal Chg=1}, the motor 22 is prohibited from being energized {the ignition switch 36 is turned on (closed), with the ignition signal Ig=1}. If the ignition signal Ig is Ig=0 and the charging instruction signal Chg is Chg=1, then the present mode of the battery 12 is the charging mode. In the charging mode, the management ECU 32 can confirm through the battery charger 28 whether the plug 30 is connected to the external AC power supply so that the battery charger 28 is actually connected to the external AC power supply.

If the ignition signal Ig is Ig=1 and the charging instruction signal Chg is Chg=0, then the present mode of the battery 12 is the discharging mode (running mode).

If the ignition signal Ig is Ig=0 and the charging instruction signal Chg is Chg=0, then the present mode of the battery 12 is the left-to-stand mode, i.e., the battery 12 is neither charged nor discharged.

If the battery 12 is in the charging mode, then the management ECU 32 closes the contactor 18 to electrically connect the battery charger 28 to the positive and negative terminals of the battery 12 in a step S11, and then turns on the battery charger 28 in a step S12.

Each time a predetermined charging time ΔTchg elapses, the management ECU 32 detects a battery voltage Vb, a battery current (charging current) Ib, and a battery temperature Tb in a step S13. The predetermined charging time ΔTchg is set to ΔTchg=1 minute, for example.

Then, the management ECU 32 calculates a remaining capacity 1 (first detected remaining capacity) according to the following equation (4) in a step S14:

$$\text{Remaining capacity 1} \leftarrow \text{remaining capacity 1} + \text{charged capacity} \times \text{charging efficiency} \quad (4)$$

According to the equation (4), a present remaining capacity 1 on the left side of the symbol← is calculated as the sum of a preceding remaining capacity 1 stored in the memory and the product of a charged capacity (the battery current Ib×the predetermined charging time ΔTchg) and a charging efficiency (which is a constant depending on the battery temperature Tb, i.e., 0.9–0.95). The equation (4) indicates that the data stored in the memory which is backed up is updated from the remaining capacity 1 on the right side of the symbol← to the remaining capacity 1 on the left side of the symbol←. All equations including the symbol← which will be described below s should be interpreted as indicating the same operation.

Then, the management ECU 32 decides in a step S15 whether the calculated remaining capacity 1 is a fully charged capacity or not. The fully charged capacity can be detected by detecting the rate at which the battery temperature rises or the rate at which the battery voltage rises, as disclosed in Japanese laid-open patent publication No. 8-331769, for example.

If the calculated remaining capacity 1 is a fully charged capacity, then the management ECU 32 resets the memory which stores the remaining capacity to store the fully charged capacity in a step S16, sets a fully charged flag to 1 in a step S17, and turns off the battery charger 28 in a step S18, after which the battery charging process is finished.

At this time, the management ECU 32 effects a remaining capacity indicating subroutine in a step S19 to control the remaining capacity indicator 40, which may comprise a light-emitting diode array or an LCD (liquid crystal display) unit, for example, to indicate the fully charged capacity in the form of bar-like light-emitting elements (charging units) 41 energized or turned on all the way from the lowermost element marked with "E" (Empty) to the uppermost element marked with "F" (Full). The energized light-emitting elements 41 are shown hatched.

If the calculated remaining capacity 1 is not a fully charged capacity in the step S15, then the management ECU 32 determines the charging instruction signal Chg from the charging instruction switch 38 in a step S20. If charging instruction signal Chg is Chg=1, i.e., if the charging of the battery 12 is not stopped, but continued, then the management ECU 32 effects the remaining capacity indicating subroutine in the step S19 to indicate the remaining capacity 1 calculated in the step S14 on the remaining capacity indicator 40. Then, control goes back to the step S1, and repeats the step S11 and following steps, for example. If the charging of the battery 12 is stopped (Chg=0) in the step S20, then the management ECU 32 resets the fully charged flag to 0 in a step S21, and turns off the battery charger 28 in the step S18. Then, the management ECU 32 effects the remaining capacity indicating subroutine in the step S19 to indicate the remaining capacity 1 calculated in the step S14, after which control returns to the step S1.

If the completion of the charging of the battery 12 (automatic completion of the charging of the battery 12) in the step S15 is not detected (NO in the step S15) and the charging of the battery 12 is manually stopped (YES in the step S20), then the management ECU 32 increases the indicated remaining capacity up to 90% of the fully charged capacity. Only when the automatic completion of the charging of the battery 12 is detected, the management ECU 32 resets the memory as described above, and indicates the remaining capacity up to the fully charged condition, i.e., 100% at the mark "F".

If the present mode of the battery 12 is the left-to-stand mode in the step S1, then the management ECU 32 starts measuring time with the timer in a step S31, and effects a self-discharged-quantity-based correction subroutine in a step S32. According to the self-discharged-quantity-based correction subroutine, the management ECU 32 calculates a self-discharged quantity with the battery temperature Tb as a parameter, based on the measured time in which the battery 12 is left to stand, and determines a remaining capacity by subtracting a remaining capacity based on the calculated self-discharged quantity from the present remaining capacity. Then, the management ECU 32 effects the remaining capacity indicating subroutine in the step S19 to indicate the remaining capacity calculated in the step S32.

If the present mode of the battery 12 is the discharging mode in the step S1, then the management ECU 32 closes the contactor 18 in a step S41, and supplies electric energy from the battery 12 through the PDU 42 to the motor 22.

Thereafter, each time a predetermined charging time ΔTdischg (e.g., ΔTdischg=1 second) elapses, the management ECU 32 detects a battery voltage Vb and a battery current (charging current) Ib in a step S42.

Then, the management ECU 32 calculates a remaining capacity 1 (first detected remaining capacity) according to the following equation (5) in a step S43:

Remaining capacity 1←remaining capacity 1−discharge ed capacity (5)

According to the equation (5), a present remaining capacity 1 on the left side of the symbol←is calculated by subtracting a discharged capacity (the battery current Ib×the predetermined charging time ΔTdischg) from the preceding remaining capacity 1 stored in the memory. The equation (5) indicates that the data stored in the memory is updated from the remaining capacity 1 on the right side of the symbol←to the remaining capacity 1 on the left side of the symbol←.

Thereafter, the management ECU 32 effects a maximum battery output power calculating subroutine to determine if the remaining capacity needs to be corrected in a step S44. The maximum battery output power is defined as the maximum electric power (unit: W) that the battery 12 can withdraw at present conditions (the remaining capacity, the temperature, etc.), and beyond which the electric power that can be withdrawn from the battery 12 cannot be increased because the battery voltage Vb would be lowered due to the product of the output current and the internal resistance. According to the present invention, there are two maximum battery output power calculating subroutines available that can be executed by the management ECU 32.

A maximum battery output power calculating subroutine according to a first embodiment of the present invention will be described below with reference to FIG. 4.

According go the first embodiment, the management ECU 32 calculates a motor output power P at the present time of the battery 12 in a step S51. If it is assumed that an instantaneous value of the discharging current at the present time based on the accelerator opening signal θap produced by a potentiometer (not shown) operated by the accelerator pedal 42 is indicated by Ib. The motor output power P is calculated by integrating the product of the battery voltage Vb and the instantaneous value Ib when the instantaneous value Ib changes from Ib=0 to Ib=Ib, according to the following equation (6):

$$\int = (Vb \times Ib) dIb \qquad (6)$$

Figure 5:
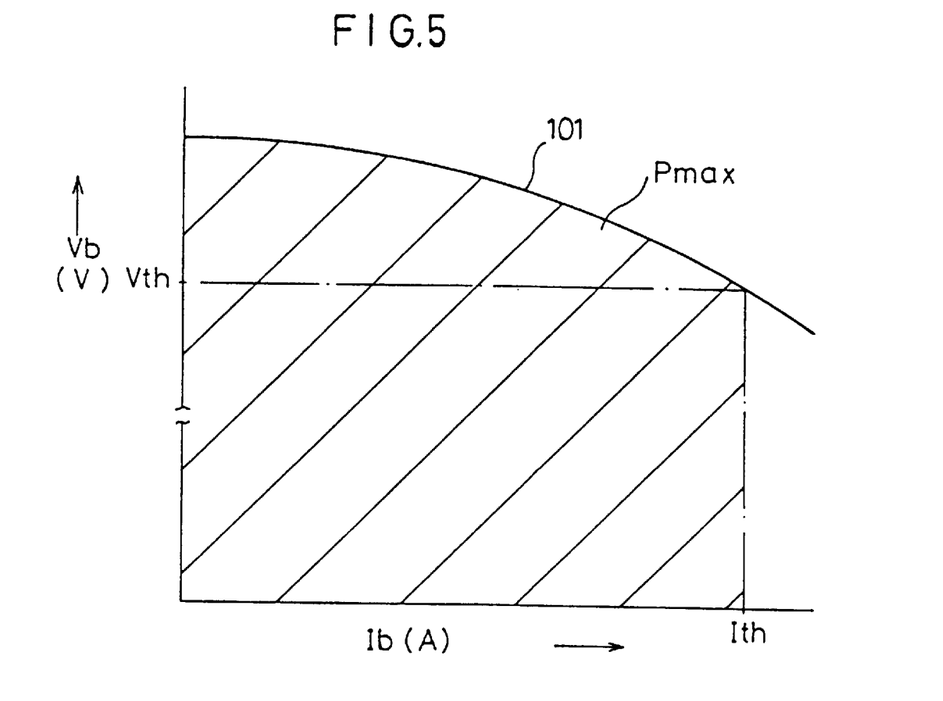
FIG. 5 is a diagram showing the output characteristic curve of a battery.

In the equation (6), the battery voltage Vb gradually decreases as the battery current Ib as it is withdrawn from the battery 12 increases, as indicated by a characteristic curve 101 shown in FIG. 5.

Then, the management ECU 32 compares the battery voltage Vb with a predetermined threshold voltage (also referred to as a power-reduction decision voltage or a power reduction decision voltage) Vth when the integrated value according to the equation (6) is calculated. The threshold voltage Vth, which may be determined depending on the type of the battery 12, is selected to be Vth=240 V (each battery cell voltage is 10 V) that is about 15% lower than the rated voltage of 288 V.

If the battery voltage Vb is smaller than the threshold voltage Vth in the step S52, then the management ECU 32 sets the integrated value calculated in the step S41 to a maximum output power Pmax (W) in a step S53. The maximum output power Pmax (W) is calculated as a hatched area (see FIG. 5) when the battery current Ib is Ib=Ith on the characteristic curve 101 of the battery voltage Vb. The battery voltage Vb when the battery current (discharging current) Ib is Ib=0 on the characteristic curve 101 is greater than the rated voltage of 288 V if the battery 12 is fully charged.

If the battery voltage Vb is greater than the threshold voltage Vth in the step S52, then the management ECU 32 does not calculate a maximum output power Pmax (W), and control exits from the subroutine in the step S44. After the calculation of the maximum output power Pmax in the step S53, control also exits from the subroutine in the step S44.

Figure 2:
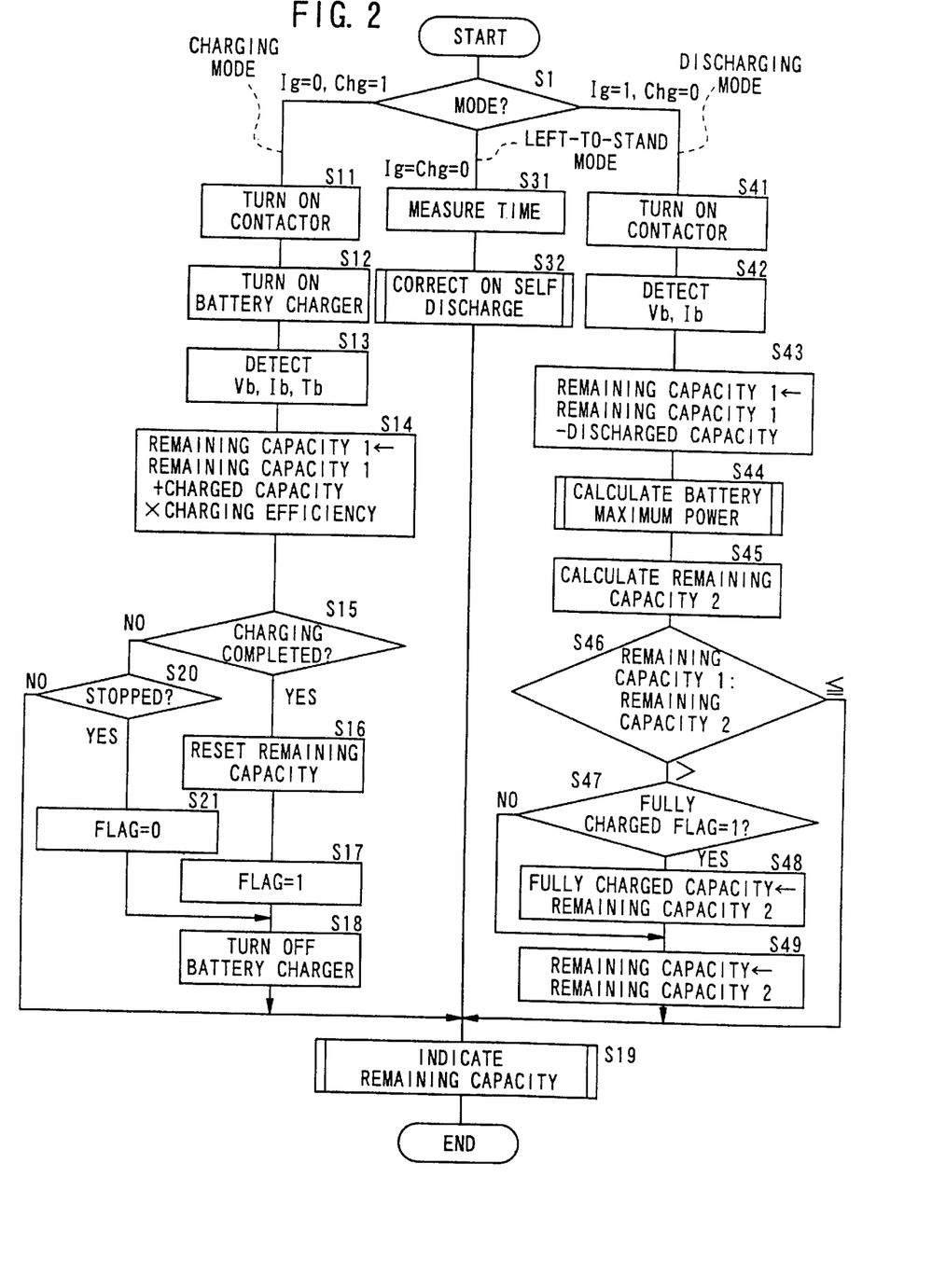
FIG. 2 is a flowchart of a control process of the remaining battery capacity detecting apparatus shown in FIG. 1.
Figure 3:
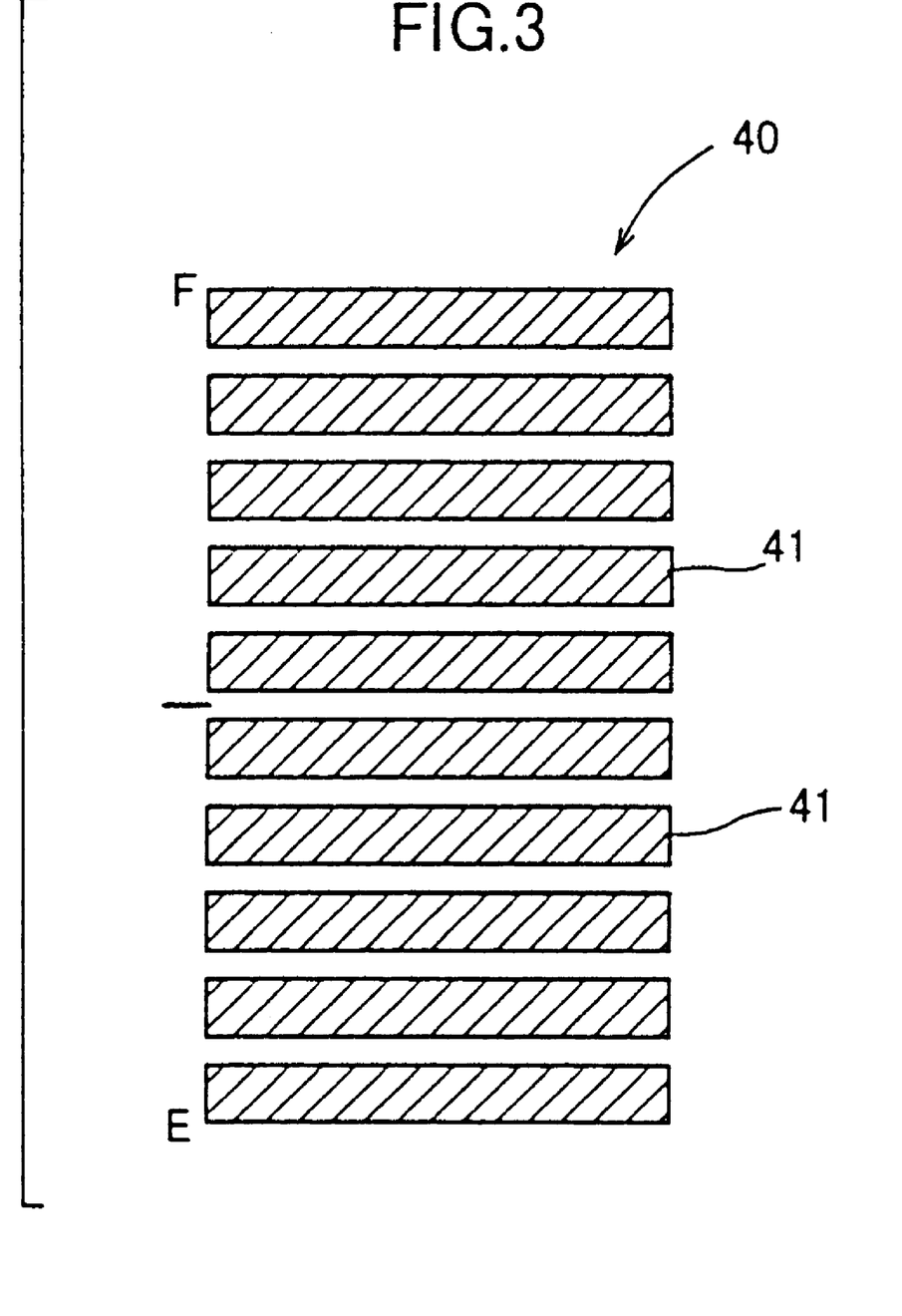
FIG. 3 is a view showing a remaining capacity indicator which indicates a fully charged condition.

In the control process shown in FIG. 2, the management ECU 32 calculates a remaining capacity 2 in a step S45. It should be noted that if the maximum output power Pmax that can be withdrawn from the battery 12 is smaller, the remaining capacity (Ah) is smaller. The relationship between the maximum output power Pmax that can be withdrawn from the battery 12 and the remaining capacity (remaining capacity 2: second detected remaining capacity) is measured, and stored as a characteristic curve 102 shown in FIG. 6 in the memory.

Figure 6:
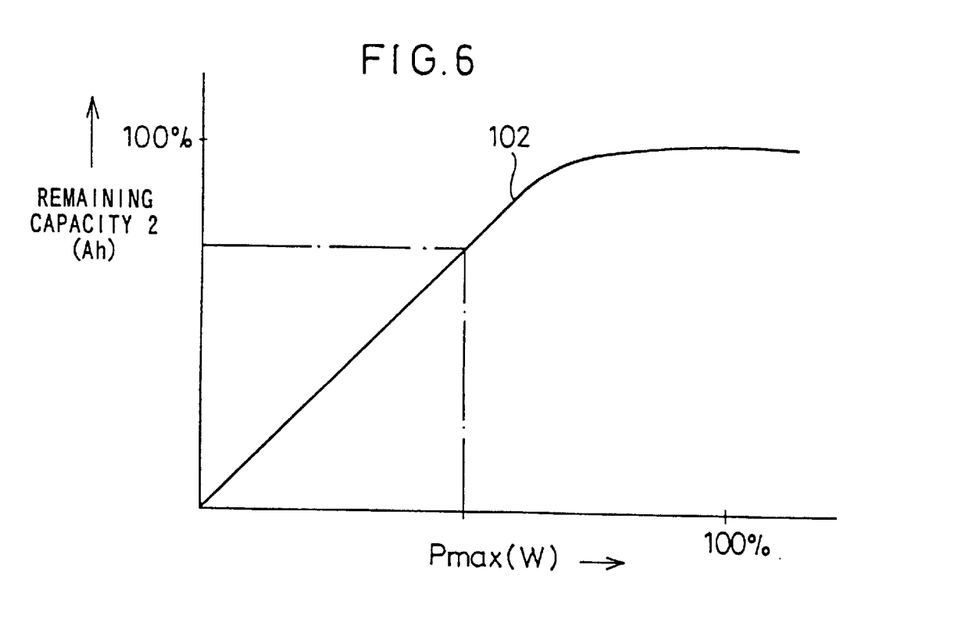
FIG. 6 is a diagram showing a curve representative of the relationship between the maximum output power of the battery and the remaining capacity thereof.

Using the characteristic curve 102, it is possible to determine the remaining capacity 2 from the maximum output power Pmax calculated in the step S53. If no present maximum output power Pmax has been calculated, then the remaining capacity 2 is calculated using the previously calculated maximum output power Pmax. Naturally, the remaining capacity 2 has not changed from the preceding cycle.

Prior to describing a next decision step S46, a maximum battery output power calculating subroutine according to a second embodiment of the present invention will be described below with reference to FIG. 7.

When the value of the accelerator opening signal θap increases and the electric power required by the motor 22 also increases, or the remaining capacity of the battery 12 is low, if the battery voltage Vb is smaller than a first threshold voltage (a power-reduction decision voltage or a power reduction decision voltage) Vth1 (Vb<Vth1) in a step S61, then the management ECU 32 gradually reduces a motor maximum output $P_{LIMIT}$ which can be generated by the motor 22 by a constant quantity (unit motor output reduction) ΔP1 in a step S62 according to the following equation (7):

$$P_{LIMIT} \leftarrow P_{LIMIT} - \Delta P1 \qquad (7)$$

In order to prevent the lower limit of the motor maximum output $P_{LIMIT}$ from becoming less than 5% of the maximum value, the management ECU 32 compares the motor maximum output $P_{LIMIT}$ calculated in the step S62 with the value of 5% in a step S63. If $P_{LIMIT}$<5%, then the management ECU 32 sets the motor maximum output $P_{LIMIT}$ to $P_{LIMIT} \leftarrow 5\%$ in a step S64.

If the battery 12 is charged in the charging mode (NO in the step r15) and the charging is manually stopped (YES in the step S20), then the voltage of the battery 12 is restored.

If Vb≧Vth1 in the step S61 and the restored battery voltage Vb is higher than a second threshold voltage (a power-reduction recovery voltage or a power reduction recovery voltage) Vth2, which is higher than the first threshold voltage Vth1, (Vb>Vth2) in a step S71, then the management ECU 32 gradually increases the motor maximum output $P_{LIMIT}$ by a constant quantity (unit motor output recovery quantity) ΔP2 in a step S72 according to the following equation (8):

$$P_{LIMIT} \leftarrow P_{LIMIT} + \Delta P2 \qquad (8)$$

The second threshold voltage Vth2 is set to Vth2=264 V with each battery cell voltage being of 11 V. In order to set the upper limit of the motor maximum output $P_{LIMIT}$ to 100% at maximum, the management ECU 32 compares the motor maximum output $P_{LIMIT}$ with the value of 100% in a step S73. If $P_{LIMIT}$=100%, then the management ECU 32 sets the motor maximum output $P_{LIMIT}$ to $P_{LIMIT} \leftarrow 100\%$ in a step S74.

Then, the management ECU 32 compares the present battery maximum output power Pmax stored in the memory with the battery maximum output power Pmax=100% at the time the battery 12 is fully charged in a step S65. If the present battery maximum output power Pmax is Pmax=100%, then the management ECU 32 does not calculate a maximum output power Pmax at the present time, but control exits from the subroutine in the step S44. This occurs if Vb≧Vth1 in the step S61, Vb>Vth2 in the step S71, and the step S74 is carried out.

If the present battery maximum output power Pmax is less than 100% (Pmax<100% in the step S65), then the management ECU 32 decides whether a change in the motor maximum output $P_{LIMIT}$ within a certain period of time is smaller than a predetermined change ΔP3 in a step S66. If a change in the motor maximum output $P_{LIMIT}$ within a certain period of time is smaller than the predetermined change ΔP3 ($P_{LIMIT}$<ΔP3) (YES in the step S66), then the management ECU 32 compares the present battery maximum output power Pmax stored in the memory with the magnitude of the motor maximum output $P_{LIMIT}$ calculated in the step S62 or the step S72 in a step S67. Only if Pmax<$P_{LIMIT}$, i.e., only if the step S62 has been carried out, the management ECU 32 changes the battery maximum output power Pmax to the motor maximum output $P_{LIMIT}$ which is either the value calculated in the step S62 or the value of 5% set in the step S64.

The conditional step S66 which requires that a change in the motor maximum output $P_{LIMIT}$ within a certain period of time is smaller than the predetermined change ΔP3, i.e., requires that the motor maximum output $P_{LIMIT}$ be stable within the certain period of time, is inserted because the motor maximum output $P_{LIMIT}$ is gradually changed in the power-reduction process. Therefore, the maximum output power Pmax that can be withdrawn from the battery 12 is updated when the motor maximum output $P_{LIMIT}$ is not changed, i.e., the battery voltage Vb is stable between the first threshold voltage Vth1 and the second threshold voltage Vth2.

If a change in the motor maximum output $P_{LIMIT}$ within a certain period of time is greater than the predetermined change ΔP3 (NO in the step S66) or if the steps S72, S73, S74 are carried out (Pmax≧$P_{LIMIT}$ in the step S67, or if Vth2>Vb>Vth1 in the steps S61, S71 (the step S66 is not satisfied or Pmax=$P_{LIMIT}$), then the management ECU 32 sets the preceding battery maximum output power Pmax stored in the memory to the battery maximum output power Pmax (Pmax←Pmax) in a step S69, and hence does not update the battery maximum output power Pmax.

The operation sequence shown in FIG. 7 will be described with reference to FIG. 8. During periods T2, T6 in which the battery voltage Vb is lower than the first threshold voltage Vth1 (Vb<Vth1), the updating step S68 is carried out (Pmax←$P_{LIMIT}$) in initial stages of periods T3, T7 in which the battery voltage Vb is stable. During the periods T3, T7 in which the battery voltage Vb is in the range of Vth1<Vb<Vth2, the value updated by Pmax←$P_{LIMIT}$ in the step S68 is maintained. Even if the battery voltage Vb is restored (Vb>Vth2) as indicated by a period T5 and the step S72 ($P_{LIMIT} \leftarrow P_{LIMIT} + \Delta P2$) is carried out, the updating step S68 is not carried out.

While the battery 12 supplies electric energy to the accessory 26 other than the motor 22, since the motor 22 is a predominant load, it is assumed that the battery maximum output power Pmax is substantially the same as the motor maximum output $P_{LIMIT}$. However, the battery maximum output power Pmax may be calculated taking into account the electric power consumed by the accessory 26.

Figure 4:
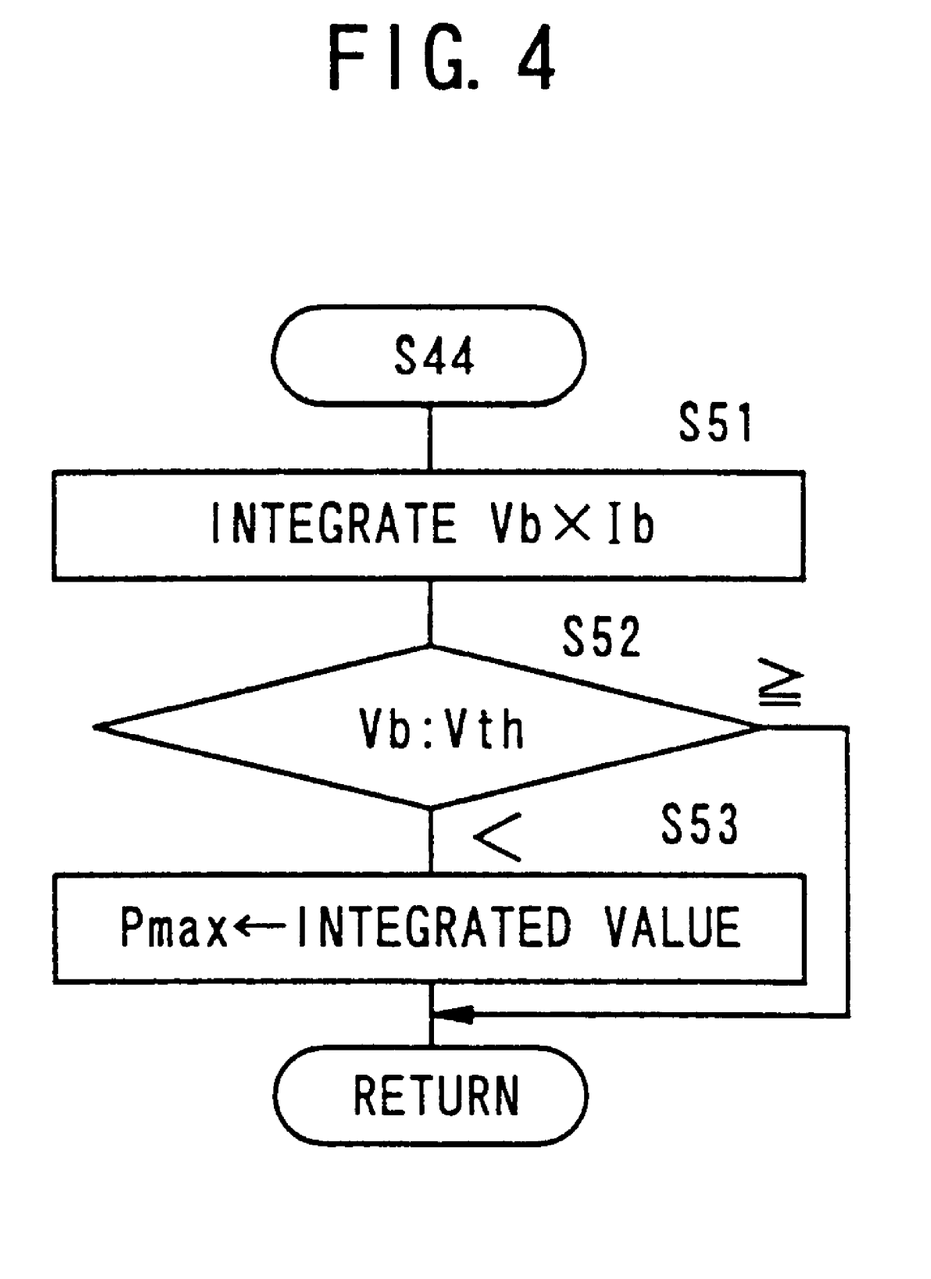
FIG. 4 is a flowchart of a maximum battery output power calculating subroutine according to a first embodiment of the present invention.
Figure 7:
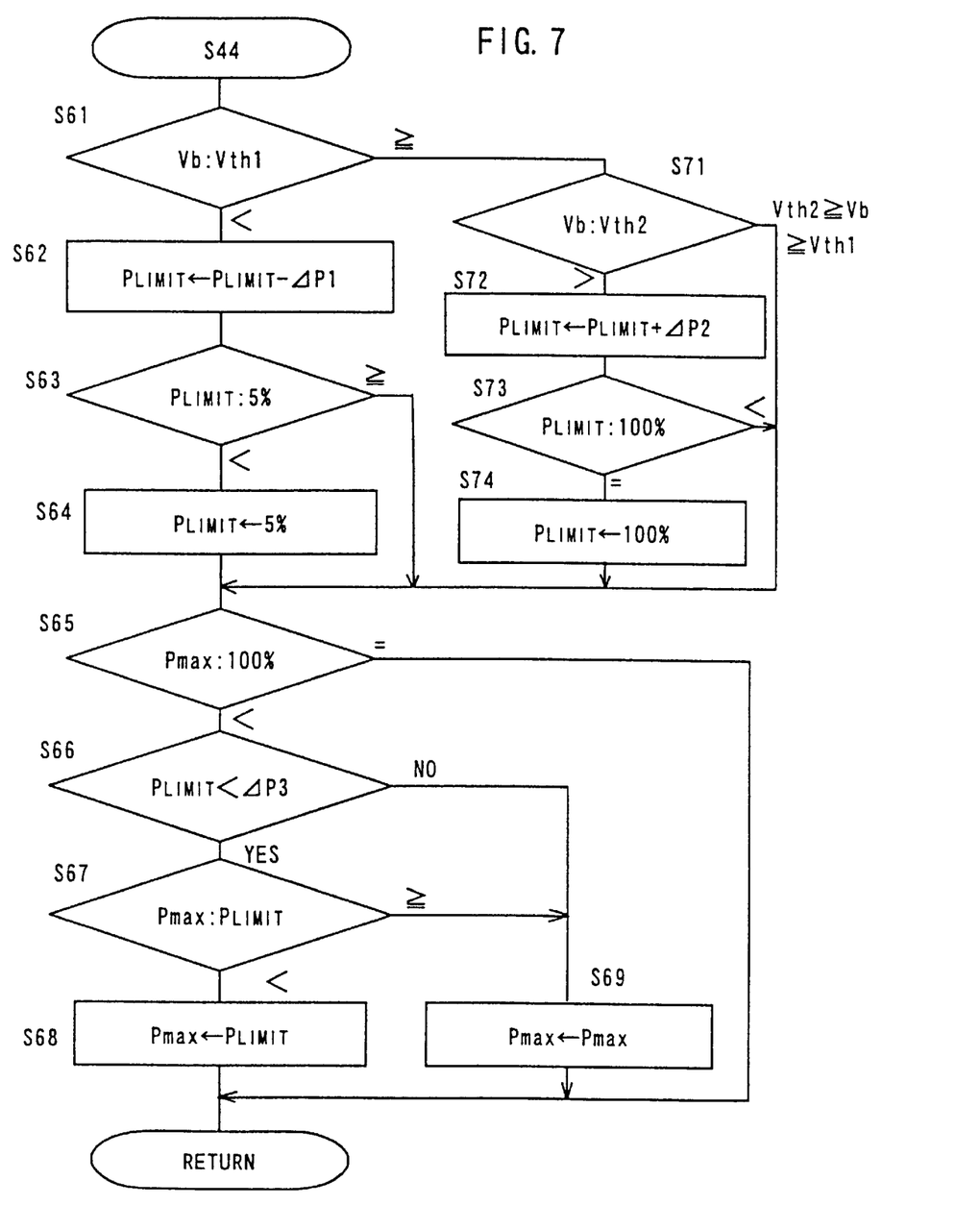
FIG. 7 is a flowchart of a maximum battery output power calculating subroutine according to a second embodiment of the present invention.
Figure 8:
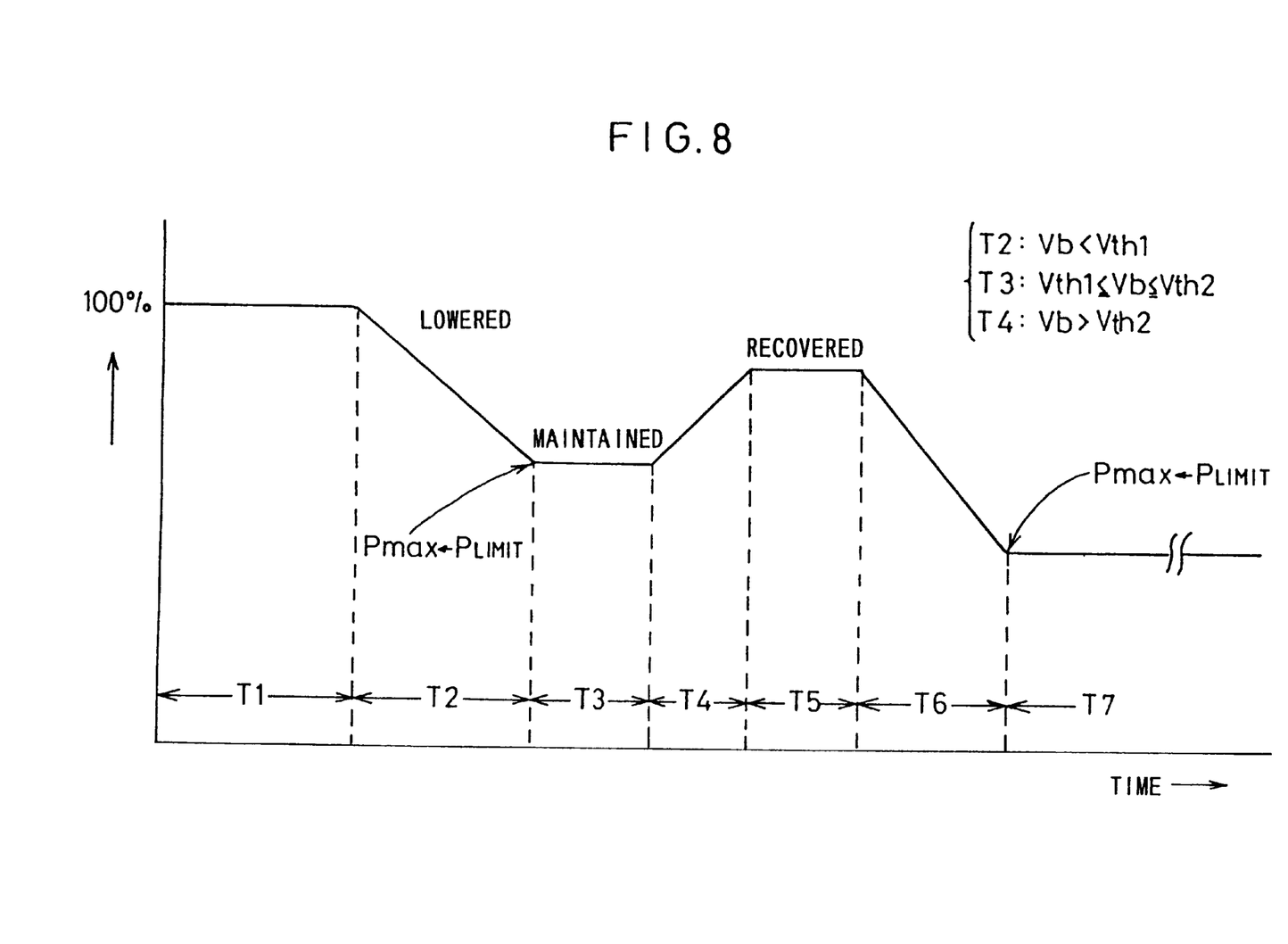
FIG. 8 is a timing chart of a process of calculating the maximum output power of the battery from the maximum output of a motor.

After the subroutine shown in FIG. 4 or FIG. 7, control goes back to the operation sequence shown in FIG. 2, and the remaining capacity 2 is calculated using the characteristic curve 102 shown in FIG. 6 in the step S45.

In the step S46, the management ECU 32 compares the remaining capacity 2 calculated from the battery maximum output power Pmax in the step S45 with the value of the remaining capacity 1 based on the integrated discharging current value calculated from the value detected by the current sensor 20 in the step S43. If the value of the remaining capacity 1 based on the integrated discharging current value is smaller than the value of the remaining capacity 2 based on the battery maximum output power Pmax, then the management ECU 32 indicates the remaining capacity 1 calculated in the step S43 on the remaining capacity indicator 40 in the step S19.

If the remaining capacity 1 is greater than the remaining capacity 2, then the management ECU 32 determines the state of the fully charged flag set in the step S17 or reset in the step S21 in a step S47 for correcting the remaining capacity (updating the remaining capacity) in a step S48 or b49.

If the fully charged flag is 1 (YES in the step S47) and the remaining capacity 1 is greater than the estimated remaining capacity 2, then the management ECU 32 judges that the battery 12 is deteriorated, and updates the fully charged capacity used in the step S16 with the value of the estimated remaining capacity 2 in a step S48. Specifically, if the battery 12 has been fully charged in the preceding cycle (the fully charged flag is 1), then since only errors of detected discharged quantities are integrated from the fully charged condition, the detected remaining capacity (calculated remaining capacity 1) is relatively accurate. Therefore, a reduction in the battery maximum output power Pmax (a reduction in the estimated remaining capacity 2) can be judged as being a reduction in the remaining capacity (estimated remaining capacity) due to a battery deterioration.

Figure 9:
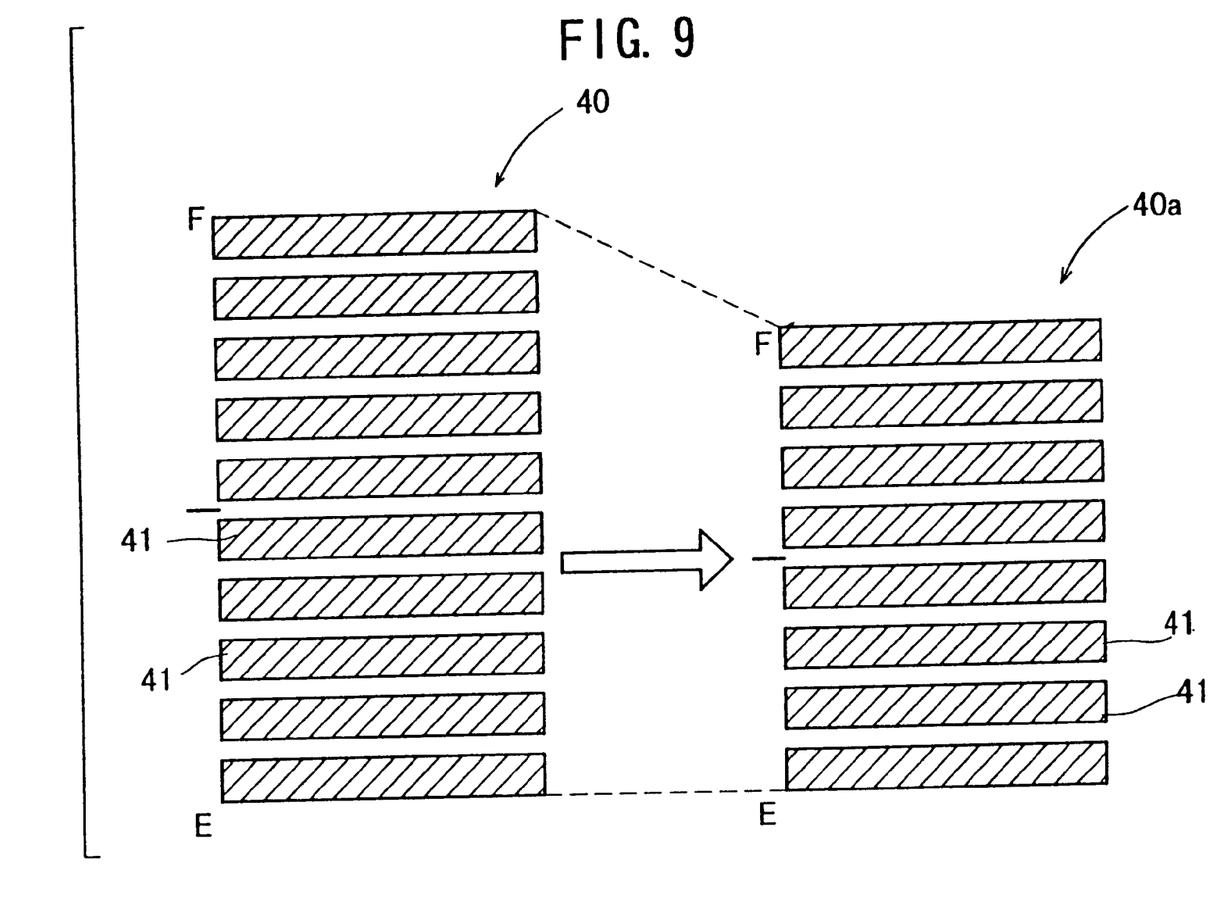
FIG. 9 is a view showing how a fully charged condition indicated by the indicator varies due to a reduction in the remaining capacity of the battery.

At this time, the number of light-emitting elements 41 which have been energized all the way from the lowermost element marked with "E" (Empty) to the uppermost element marked with "F" (Full) is reduced, displaying a remaining capacity indication pattern 40a on a reduced scale, as shown in FIG. 9. In FIG. 9, the number of energized light-emitting elements 41 is reduced from 10 to 8, indicating that the battery 12 is deteriorated 20%. The driver of the electric vehicle can now recognize that the fully charged capacity (rated battery capacity) is lowered (deteriorated) with the position of "F" based on the number of energized light-emitting elements 41, i.e., the overall h eight of the bars represented by the energized light-emitting elements 41.

If the battery has not be fully charged in the preceding charging cycle (the fully charged flag=0) in the step S47, then since errors of values detected by the current sensor 20 are integrated due to repeated charging and discharging cycles, it is possible that the detected remaining capacity (the calculated remaining capacity 1) may suffer a large error. Therefore, inasmuch as the reduction in the battery maximum output Pmax (the reduction in the estimated remaining capacity 2) can be judged as being caused by an estimated error of the detected remaining capacity (the calculated remaining capacity 1), the management ECU 32 does not carry out the correcting step S48, but updates the remaining capacity stored in the memory with the estimated remaining capacity 2 in the step S49.

Figure 10:
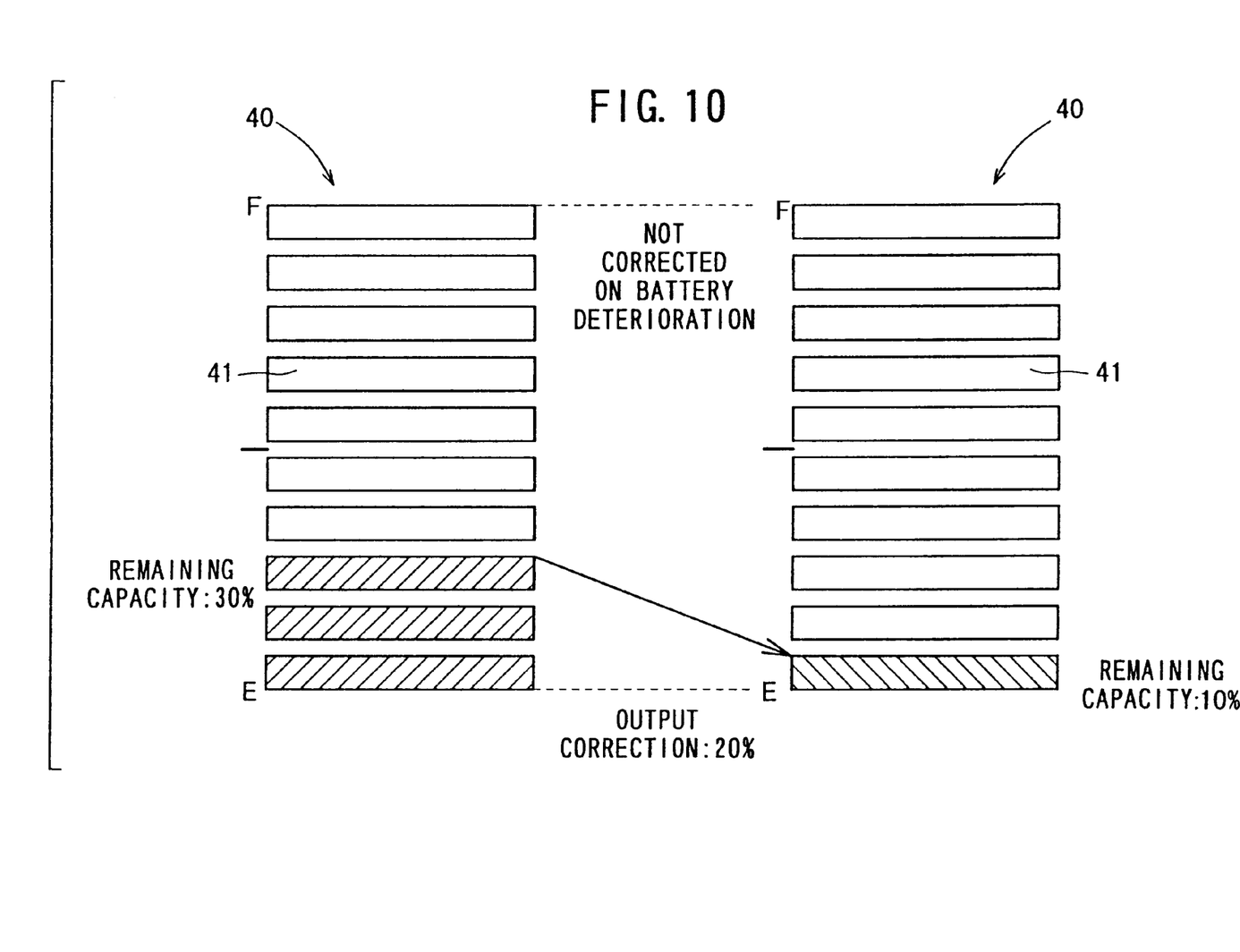
FIG. 10 is a view showing a remaining capacity indicated by the indicator before being corrected on the basis of a battery deterioration.

Based on the updated remaining capacity, the management ECU 32 updates the indicated remaining capacity on the remaining capacity indicator 40 in the step S19. If the fully charged capacity is not corrected on the basis of a battery deterioration in the step S48, then the remaining capacity is indicated on the remaining capacity indicator 40 as shown in FIG. 10. For example, if the corrected quantity is 20%, then the number of all charging units 41 remains unchanged from 10 (corresponding to the remaining capacity of 100%), and the number of charging units 41 shown hatched is changed from 3 (corresponding to the remaining capacity of 30%) to 1 (corresponding to the remaining capacity of 10%).

Figure 11:
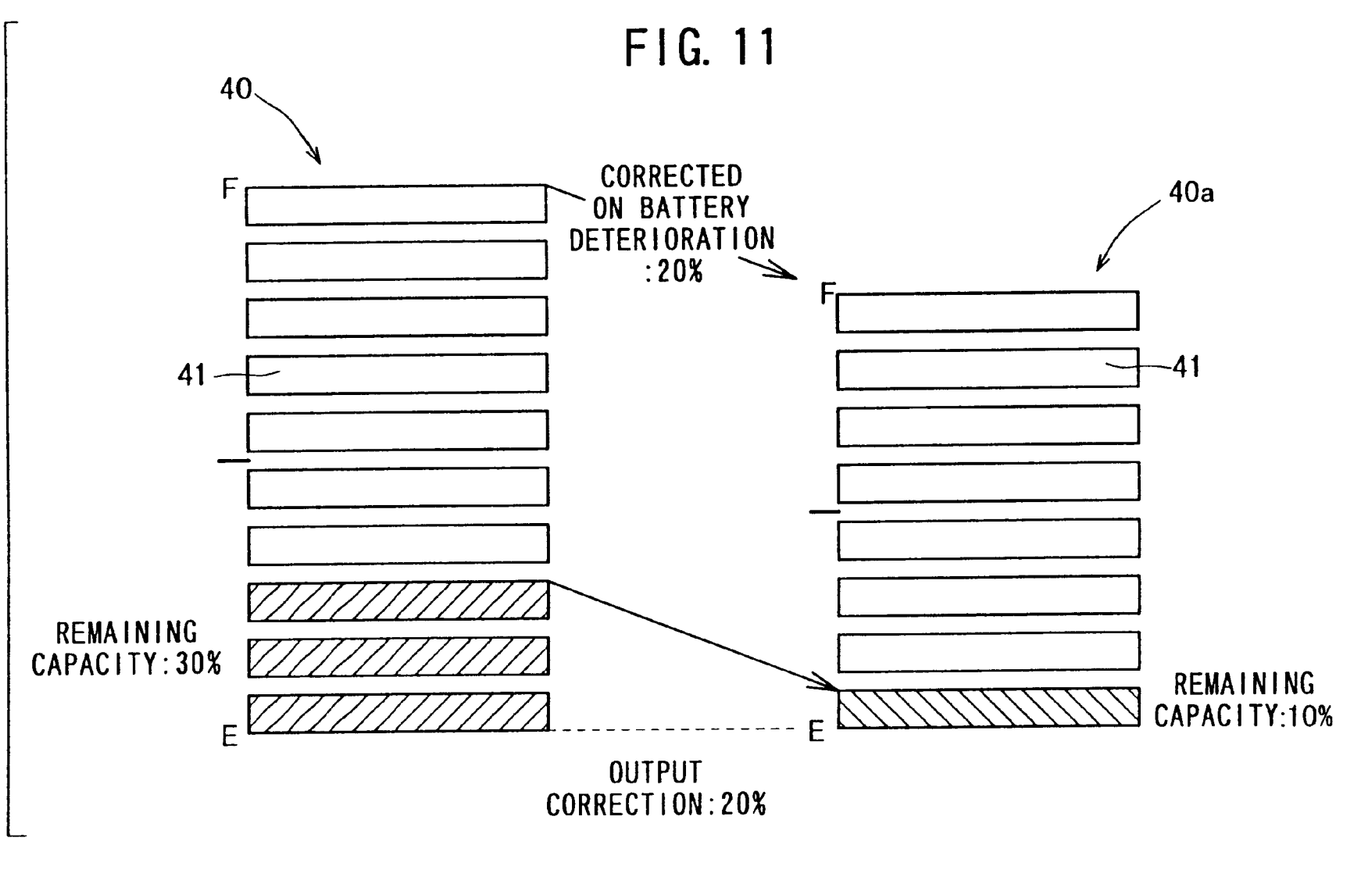
FIG. 11 is a view showing a remaining capacity indicated by the indicator after being corrected on the basis of a battery deterioration.

If the fully charged capacity is corrected on the basis of a battery deterioration in the step S48, then the remaining capacity is indicated on the remaining capacity indicator 40 as shown in FIG. 11. For example, if the corrected quantity is 20%, then the number of all charging units 41 is reduced to 8 (corresponding to the remaining capacity of 100%) as indicated by a remaining capacity indication pattern 40a, and the remaining capacity of 10% is indicated by only one charging unit 41 shown hatched.

Figure 12:
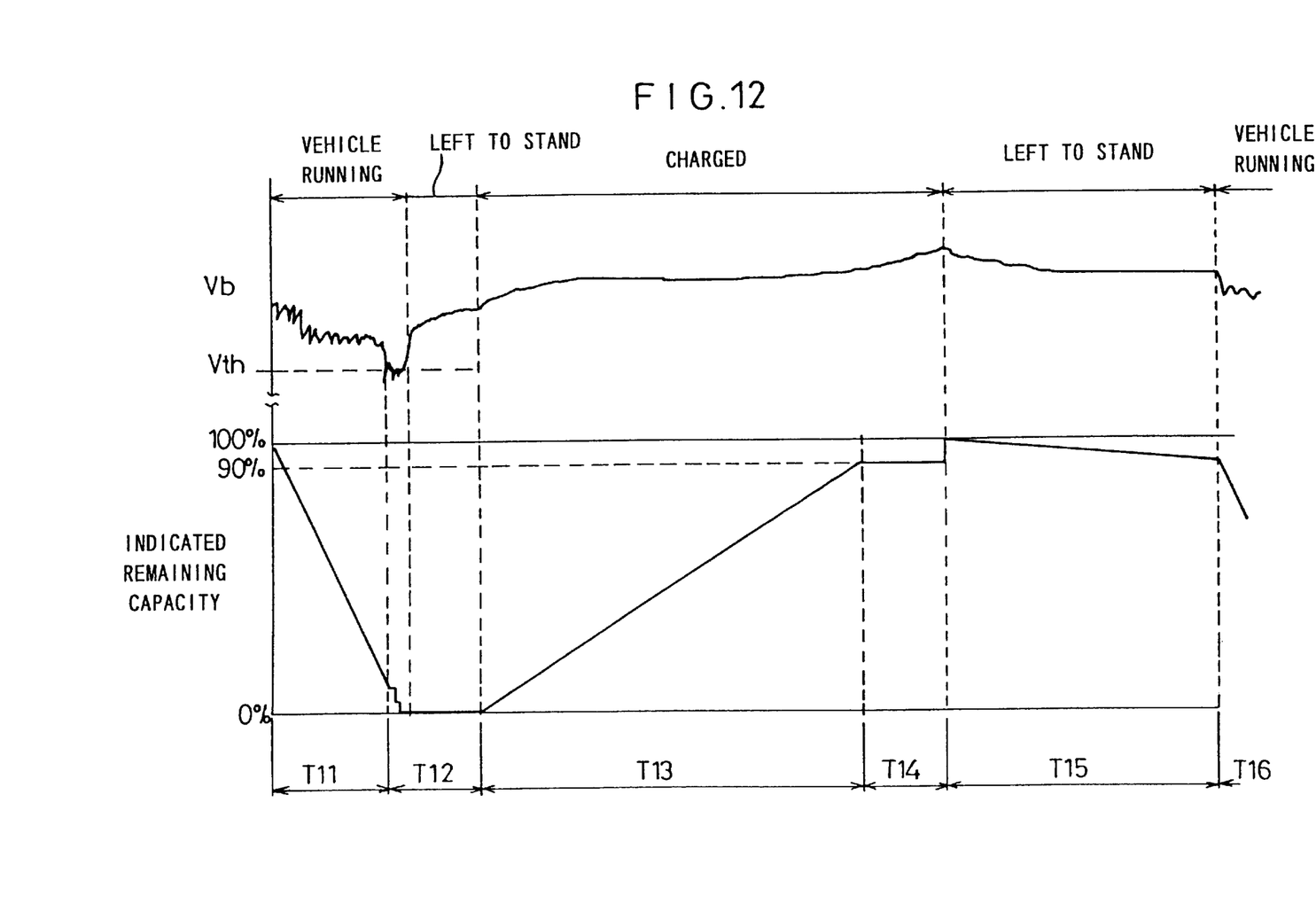
FIG. 12 is a timing chart of overall operation of the remaining battery capacity detecting apparatus according to the present invention.

FIG. 12 illustrates overall operation of the remaining battery capacity detecting apparatus according to the present invention for correcting the indicated remaining capacity, the remaining battery capacity detecting apparatus incorporating the subroutine shown in FIG. 4.

A period T11 is a period in which the electric vehicle 10 runs. In the period T11, the indication of a remaining capacity is updated according to the equation (5) effected in the step S43. A period T12 includes an initial zone in which the electric vehicle 10 runs. In the initial zone of the period T12, the battery voltage Vb is lower than a threshold voltage (a power-reduction decision voltage or a power reduction decision voltage) Vth for a certain time, so that the power-reduction process in the steps S62–S68 is carried out. In the period T12, the estimated remaining capacity 2 determined with reference to FIG. 6 is indicated.

A period T13 is a period in which the battery 12 is charged with constant electric power. In the period T13, the indication of a remaining capacity is updated according to the equation (4) effected in the step S14.

A period T14 is a period in which the fully charged condition is judged in view of a rate of time-depending change of the battery temperature Tb (dTb/dt). When the fully charged condition is satisfied, the remaining capacity is reset to 100% (the step S16). If the fully charged condition is satisfied, but the charging of the battery 12 is manually stopped (YES in the step S20), the maximum value of the indicated remaining capacity is limited to 90%.

A period T15 is a period in which the battery 12 is left to stand. In the period T15, the remaining capacity is corrected according to a known self-discharged-quantity-based correction process. A period T16 is a period in which the electric vehicle 10 runs. The same process as in the period T11 is carried out in the period T16.

As described above, the management ECU 32 compares the first detected remaining capacity (remaining capacity 1←remaining capacity 1–discharged capacity) detected in the step S43 based on the integrated value of the discharging current with the second detected remaining capacity (remaining capacity 2) detected on the basis of the maximum output power Pmax at the present time of the battery 12, and determines a remaining capacity based on the result of comparison. Since the maximum output power Pmax at the present time depends on the remaining capacity at the present time, the remaining capacity after repeated charging and discharging cycles can be detected accurately by being determined with respect to the second detected remaining capacity (remaining capacity 2).

More specifically, if the management ECU 32 detects that the difference (remaining capacity 1–remaining capacity 2) between the first detected remaining capacity (remaining capacity 1) and the second detected remaining capacity (remaining capacity 2) is greater than a predetermined value and the battery 12 has been charged to the fully charged capacity by the battery charger 28 in the preceding cycle, then the management ECU 32 can subsequently detect a remaining capacity in view of a deterioration of the battery 12 by correcting the fully charged capacity into the second detected remaining capacity (remaining capacity 2).

According to the present invention, as described above, not only the integrated value of the discharging current is detected, but also the output power of the battery at the present time is considered, for determining the remaining capacity of the battery. Therefore, the remaining capacity of the battery can be detected highly accurately.

Furthermore, a deterioration of the battery can also be detected on the basis of the output power of the battery at the present time, so that the initial capacity (fully charged capacity) of the battery can be corrected into an appropriate value.

Although certain preferred embodiments of the present invention have been shown and described in detail, it should be understood that various changes and modifications may be made therein without departing from the scope of the appended claims.

What is claimed is:

1. An apparatus for detecting the remaining capacity of a battery, comprising:

battery discharging current detecting means for detecting a discharging current from the battery;

charging current integrating means for integrating said discharging current;

first remaining capacity detecting means for detecting a first remaining capacity of the battery based on the integrated discharging current;

second remaining capacity detecting means for detecting a second remaining capacity of the battery based on output power of the battery at a present time; and remaining capacity determining means for comparing said first remaining capacity and said second remaining capacity with each other and determining a remaining capacity of the battery depending on the result of comparing said first remaining capacity and said second remaining capacity with each other.

2. An apparatus according to claim 1, further comprising:

battery voltage detecting means for detecting a battery voltage across the battery;

said second remaining capacity detecting means comprising means for calculating an integrated value by integrating the product of the discharging current detected by said battery discharging current detecting means and the battery voltage detected by said battery voltage detecting means with respect to the discharging current, comparing said battery voltage with a predetermined power-reduction decision voltage when said integrated value is calculated, regarding said integrated value as an output power of the battery at a present time if said battery voltage is smaller than said predetermined power-reduction decision voltage, and determining said second remaining capacity by referring to a predetermined relationship between output powers and remaining capacities of the battery.

3. An apparatus according to claim 2, wherein said second remaining capacity detecting means comprises means for reducing said second remaining capacity by a predetermined value when the battery voltage detected by said battery voltage detecting means is smaller than said power-reduction decision voltage.

4. An apparatus according to claim 3, wherein said second remaining capacity detecting means comprises means for increasing said second remaining capacity by a predetermined value when the battery voltage detected by said battery voltage detecting means is greater than a power-reduction recovery voltage which is higher than said power-reduction decision voltage.

5. An apparatus according to claim 1, wherein said remaining capacity determining means comprises means for comparing said first remaining capacity detected by said first remaining capacity detecting means with said second remaining capacity detected by said second remaining capacity detecting means, and determining the remaining capacity of the battery as said first remaining capacity if said first remaining capacity is smaller than said second remaining capacity.

6. An apparatus according to claim 1, wherein said remaining capacity determining means comprises means for comparing said first remaining capacity detected by said first remaining capacity detecting means with said second remaining capacity detected by said second remaining capacity detecting means, and determining the remaining capacity of the battery as said second remaining capacity if said first remaining capacity is greater than said second remaining capacity.

7. An apparatus according to claim 1, further comprising:

a battery charger for charging the battery; and fully charged condition detecting means for detecting whether the battery is charged to a fully charged capacity by said battery charger;

said remaining capacity determining means comprising means for correcting a fully charged capacity of the battery with said second remaining capacity when said first remaining capacity detected by said first remaining capacity detecting means is greater than said second remaining capacity detected by said second remaining capacity detecting means and said battery has been charged in a preceding cycle to the fully charged capacity by said battery charger a s detected by said fully charged condition detecting means.

8. An apparatus according to claim 7, further comprising:

a remaining capacity indicator for indicating a remaining capacity; and remaining capacity indication determining means for determining a remaining capacity to be indicated by said remaining capacity indicator;

said remaining capacity determining means comprising means for indicating the fully charged capacity on a reduced scale on said remaining capacity indicator when said fully charged capacity is corrected with said second remaining capacity.

9. An apparatus according to claim 1, further comprising:

a battery charger for charging the battery;

charged condition stop determining means for determining whether charging of the battery with said battery charger is stopped;

fully charged condition detecting means for detecting whether the battery is charged to a fully charged capacity by said battery charger;

a remaining capacity indicator for indicating a remaining capacity; and remaining capacity indication determining means for determining a remaining capacity to be indicated by said remaining capacity indicator;

said remaining capacity determining means comprising means for indicating a remaining capacity on said remaining capacity indicator when the battery is not detected as being charged to the fully charged capacity by said fully charged condition detecting means and the charging of the battery is stopped as determined by said charged condition stop determining means, while a maximum value of the remaining capacity indicated on said remaining capacity indicator when the battery is charged to the fully charged capacity is being limited to a predetermined value.

* * * * *